(12) United States Patent
Larosa et al.

(10) Patent No.: US 12,537,173 B2
(45) Date of Patent: Jan. 27, 2026

(54) SUBSTRATE SUPPORT PEDESTAL

(71) Applicant: Applied Materials, Inc., Santa Clara, CA (US)

(72) Inventors: Steven Joseph Larosa, Mission Viejo, CA (US); Stephen Prouty, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 679 days.

(21) Appl. No.: 17/953,205

(22) Filed: Sep. 26, 2022

(65) Prior Publication Data

US 2023/0019718 A1 Jan. 19, 2023

Related U.S. Application Data

(62) Division of application No. 16/422,692, filed on May 24, 2019, now Pat. No. 11,456,161.

(Continued)

(51) Int. Cl.
*H01J 37/00* (2006.01)
*H01J 37/32* (2006.01)
*H01L 21/683* (2006.01)

(52) U.S. Cl.
CPC .... *H01J 37/32724* (2013.01); *H01J 37/3244* (2013.01); *H01L 21/6833* (2013.01); *H01J 2237/002* (2013.01)

(58) Field of Classification Search
CPC .. H01J 37/32; H01J 37/32724; H01J 37/3244; H01J 2237/002; H01L 21/6833;

(Continued)

(56) References Cited

U.S. PATENT DOCUMENTS 6,490,144 B1 12/2002 Narendrnath et al.
6,917,508 B2 * 7/2005 Kim .................... H01L 21/6831
156/345.47

(Continued)

FOREIGN PATENT DOCUMENTS

CN 101533763 A 9/2009
CN 104952779 A 9/2015

(Continued)

OTHER PUBLICATIONS

Search Report /Office Action for Taiwan Application No. 108119261 dated Jan. 10, 2023.

(Continued)

*Primary Examiner* — Harry E Arant
(74) *Attorney, Agent, or Firm* — Patterson + Sheridan, LLP

(57) ABSTRACT

The systems and methods discussed herein are associated with substrate support pedestals used in processing chambers to manufacture semiconductors, electronics, optics, and other devices. The substrate support pedestals include an electrostatic chuck body bonded to a cooling base via a bond layer. A gas flow passage is formed between a top surface of the electrostatic chuck body and a bottom surface of the cooling base, and a porous plug is positioned in the gas flow passage. The gas flow passage passes through a hole in the bond layer and the porous plug and has a swept volume physically shielded from an inside edge of the hole in the bond layer, protecting the bond layer from erosion.

19 Claims, 9 Drawing Sheets

Related U.S. Application Data

(60) Provisional application No. 62/680,224, filed on Jun. 4, 2018.

(58) Field of Classification Search
CPC ........... H01L 21/68785; H01L 21/6831; H01L 21/67109
See application file for complete search history.

(56) References Cited

U.S. PATENT DOCUMENTS

| | | |
|---|---|---|
| 8,449,786 B2 | 5/2013 | Larson et al. |
| 9,627,240 B2 | 4/2017 | Yamaguchi et al. |
| 9,685,356 B2 | 6/2017 | Parkhe et al. |
| 9,960,067 B2 | 5/2018 | Anada et al. |
| 10,688,750 B2 | 6/2020 | Parkhe et al. |
| 2004/0120095 A1 | 6/2004 | Yanagida |
| 2004/0196614 A1 | 10/2004 | Miyaji et al. |
| 2009/0034149 A1 | 2/2009 | Lubomirsky et al. |
| 2009/0229753 A1 | 9/2009 | Ohmi et al. |
| 2010/0156054 A1 | 6/2010 | Sun et al. |
| 2011/0272899 A1 | 11/2011 | Shimazu |
| 2013/0088808 A1 | 4/2013 | Parkhe et al. |
| 2013/0308244 A1 | 11/2013 | Shiraiwa et al. |
| 2014/0376148 A1 | 12/2014 | Sasaki et al. |
| 2015/0279714 A1 | 10/2015 | Yamaguchi et al. |
| 2015/0332942 A1 | 11/2015 | Peh et al. |
| 2016/0276196 A1 | 9/2016 | Parkhe |
| 2016/0276198 A1 | 9/2016 | Anada et al. |
| 2016/0352260 A1 | 12/2016 | Comendant |
| 2017/0243726 A1 | 8/2017 | Kellogg |
| 2017/0256431 A1 | 9/2017 | Parkhe |
| 2018/0025933 A1 | 1/2018 | Ishimura et al. |
| 2018/0090361 A1 | 3/2018 | Sasaki et al. |
| 2019/0099977 A1 | 4/2019 | Parkhe et al. |
| 2019/0267277 A1 | 8/2019 | Sasaki et al. |
| 2020/0105568 A1 | 4/2020 | Pilgrim |
| 2020/0279765 A1* | 9/2020 | Furukawa ......... H01L 21/68757 |

FOREIGN PATENT DOCUMENTS

| | | |
|---|---|---|
| JP | 2001102436 A | 4/2001 |
| JP | 2004088063 A | 3/2004 |
| JP | 2008047657 A | 2/2008 |
| JP | 2013131541 A | 7/2013 |
| JP | 2013243267 A | 12/2013 |
| JP | 2015195346 A | 11/2015 |
| JP | 6110159 B2 | 4/2017 |
| JP | 2017162899 A | 9/2017 |
| JP | 2017206974 A | 11/2017 |
| JP | 2018101773 A | 6/2018 |
| KR | 20150112777 A | 10/2015 |
| TW | 526521 B | 4/2003 |

OTHER PUBLICATIONS

Korean Office Action for Application No. 10-2019-0065387 dated Jan. 22, 2024.
Japanese Office Action for Application No. 2019-103453 dated May 23, 2023.
International Search Report and Written Opinion for Application No. PCT/US2019/018589 dated May 31, 2019.
International Search Report and Written Opinion for Application No. PCT/US2020/029211 dated Aug. 12, 2020.
Chinese Office Action for Application No. 201910484041.5 dated Nov. 28, 2023.
Japanese Office Action for Application No. 2019-103453 dated Feb. 26, 2024.
Korean Office Action for Application No. 10-2024-0190662 dated Jun. 30, 2025.

* cited by examiner

SUBSTRATE SUPPORT PEDESTAL

CROSS-REFERENCE TO RELATED APPLICATIONS

This application is a divisional of U.S. Non-Provisional patent application Ser. No. 16/422,692, filed May 24, 2019, which claims priority to U.S. Provisional Application No. 62/680,224, filed Jun. 4, 2018, each of which are herein incorporated by reference in its entirety.

BACKGROUND OF THE DISCLOSURE

Field of Invention

The embodiments of the invention generally relate to a substrate support pedestal having a protected bonding layer for use in a substrate process chamber.

BACKGROUND OF THE INVENTION

Substrate support pedestal are widely used to support substrates within semiconductor processing systems during processing. A particular type of substrate support pedestal includes a ceramic electrostatic chuck mounted on a cooling base. Electrostatic chucks generally retain the substrate in a stationary position during processing. Electrostatic chucks contain one or more embedded electrodes within a ceramic body. As an electrical potential is applied between the electrodes and a substrate disposed on the ceramic body, an electrostatic attraction is generated which holds the substrate against a support surface of the ceramic body. The force generated may be a capacitive effect due to a potential difference between the substrate and the electrodes or, in the case of ceramic bodies comprised of semiconducting materials having a relatively low resistivity which allow charge migration within the ceramic body to the surface approximate the substrate, a Johnsen-Rahbeck effect. Electrostatic chucks utilizing capacitive and Johnsen-Rahbeck attractive forces are commercially available from a number of sources.

To control the substrate temperature during processing, a backside gas is provided between the support surface of the ceramic body and the substrate. Generally, the backside gas fills the interstitial area between the ceramic body and the substrate, thus providing a heat transfer medium that enhances the rate of heat transfer between the substrate and the substrate support.

The bond layer securing the electrostatic chuck to the cooling base is susceptible to erosion by the process gas passing through the bond layer. Additionally, the inventors have discovered that the bond layer may be further eroded if backside gas becomes ignited into a plasma, energized or otherwise facilitates arcing in the portion of the backside gas channel passing through the substrate support pedestal that is exposed to the bond layer. The erosion of bond layer is problematic for at least two reasons. First, material eroded from bond layer is a process contaminant that produces defects and reduces product yields. Secondly, as the hole in the bond layer through which the backside gas passes increases in size, the local rate heat transfer between the electrostatic chuck and cooling base changes as the bond material is replaced by a gap, thereby creating undesirable temperature non-uniformities and process drift.

Therefore, there is a need for an improved substrate support pedestal.

SUMMARY OF THE INVENTION

Substrate support pedestals having a bond layer shielded from direct exposure to a gas flow path passing through the bond layer are disclosed herein. Since the bond layer is shielded from the direct flow of gas, process or backside, being delivered through the substrate support pedestal via the gas flow path, the bond layer is much less susceptible to erosion which preserves the integrity of the electrostatic chuck assembly.

In an embodiment, a substrate support pedestal includes: an electrostatic chuck body bonded to a cooling base via a bond layer; a porous plug; and a gas flow passage formed between a top surface of the electrostatic chuck body and a bottom surface of the cooling base. The gas flow passage passes through a hole in the bond layer and the porous plug, the gas flow passage has a swept volume physically shielded from an inside edge of the hole in the bond layer.

In another embodiment, a substrate support pedestal includes: an electrostatic chuck body bonded to a cooling base via a bond layer, the bond layer having a thickness defining a gap between the electrostatic chuck body and the cooling base, wherein a cavity is formed in a bottom surface of the electrostatic chuck body. The substrate support pedestal further includes a porous plug; a sleeve disposed around the porous plug; and a gas flow passage formed between a top surface of the electrostatic chuck body and a bottom surface of the cooling base. The gas flow passage passes through a hole in the bond layer and the porous plug and has a swept volume physically shielded from an inside edge of the hole in the bond layer by at least one of the sleeve. The substrate support pedestal further includes a ring extending from one of the electrostatic chuck body and the cooling base, and a ring, wherein the porous plug is defined by a top portion having a top diameter and a bottom portion having a bottom diameter. The top portion of the porous plug extends into the chuck cavity and the bottom portion extends into a base cavity formed in the top of the cooling base, and the top diameter of the porous plug is larger than the bottom diameter.

In another embodiment, a substrate support pedestal includes: an electrostatic chuck body bonded to a cooling base via a bond layer, the bond layer having a thickness defining a gap between the electrostatic chuck body and the cooling base. The electrostatic chuck body includes a first chuck cavity formed in a bottom surface of the electrostatic chuck body and a second chuck cavity formed through the first chuck cavity. The substrate support pedestal further includes a porous plug, wherein the porous plug has a plug height that is equal to or less than a height of the second chuck cavity and the porous plug does not extend into the first chuck cavity. The substrate support pedestal can further include a sleeve disposed around the porous plug, wherein the sleeve does not extend into the cooling base; and a gas flow passage formed between a top surface of the electrostatic chuck body and a bottom surface of the cooling base. The gas flow passage passing through a hole in the bond layer and the porous plug. The gas flow passage has a swept volume physically shielded from an inside edge of the hole in the bond layer by at least one of the sleeve, a ring extending from one of the electrostatic chuck body and the cooling base, or a ring.

BRIEF DESCRIPTION OF DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

The systems and methods discussed herein employ substrate support pedestal designs that have a cooling base and electrostatic chuck bonded together via a bond layer. The coupling of the cooling base and chuck in combination with a porous plug positioned in between the cooling base and chuck protects forms a gas passage that may be referred to as a gas flow path that extends through the bond layer. The embodiments discussed herein for substrate support pedestal designs shield the bond layer from the gas flow path, thus preventing degradation of the bond layer which can lead to an undesirable temperature profile.

Figure 1:
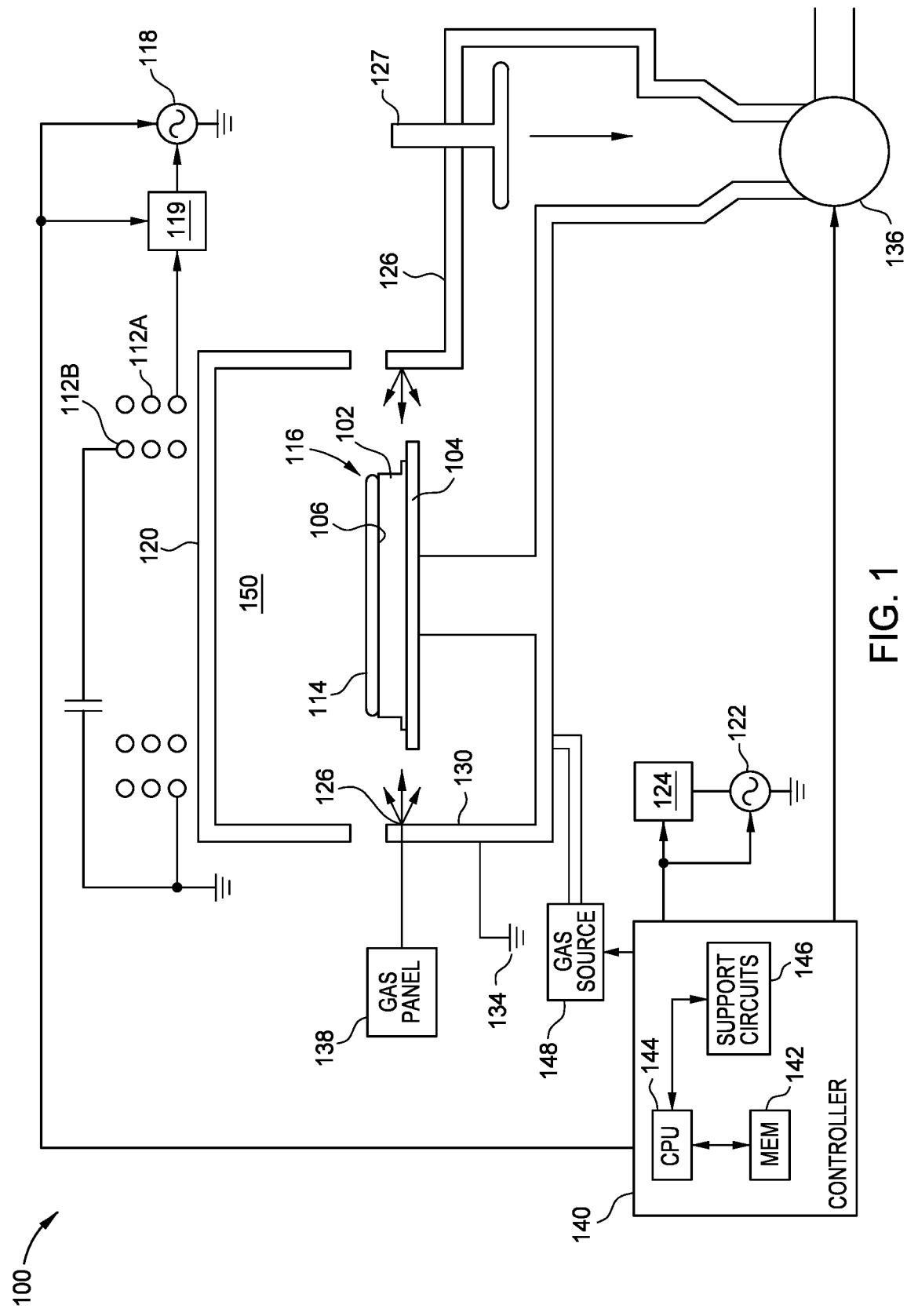
FIG. 1 depicts a schematic of a process chamber having one embodiment of substrate support pedestal disposed therein.

FIG. 1 depicts a schematic diagram of a process chamber 100 that includes an antenna that can be a coiled antenna. In one example, the process chamber 100 includes at least a first antenna segment 112A and a second antenna segment 1128, both positioned exterior to a dielectric, ceiling 120. The first antenna segment 112A and the second antenna segment 1128 are each coupled to a first radio-frequency (RF) source 118 that is generally capable of producing an RF signal. The first RF source 118 is coupled to the first antenna segment 112A and to the second antenna segment 1128 through a matching network 119. Process chamber 100 also includes a substrate support pedestal 116 that is coupled to a second RF source 122 that is generally capable of producing an RF signal. The second RF source 122 is coupled to the substrate support pedestal 116 through a matching network 124. The process chamber 100 also contains a chamber wall 130 that is conductive and that is electrically connected to an electrical ground 134. A controller 140 that includes a central processing unit (CPU) 144, a memory 142, and support circuits 146 for the CPU 144 is coupled to the various components of the process chamber 100 to facilitate control of the etch process.

In operation, the semiconductor substrate 114 is placed on the substrate support pedestal 116 and gaseous components are supplied from a gas panel 138 to the process chamber 100 through entry ports 126 to form a gaseous mixture in a processing space 150. The gaseous mixture in the processing space 150 is ignited into a plasma in the process chamber 100 by applying RF power from the first 118 and second 122 RF sources respectively to the first antennae segment 112A and the second antennae segment 1128 and further to the substrate support pedestal 116. The pressure within the interior of the process chamber 100 is controlled using a throttle valve 127 situated between the process chamber 100 and a vacuum pump 136. The temperature at the surface of the chamber walls 130 is controlled using liquid-containing conduits (not shown) that are located in the chamber walls 130 of the process chamber 100. Chemically reactive ions are released from the plasma and strike the substrate; thereby removing exposed material from the substrate's surface.

The substrate support pedestal 116 includes an electrostatic chuck 102 positioned on a cooling base 104, which may be referred to in various embodiments as a cooling base 104. The temperature of the semiconductor substrate 114 is controlled by stabilizing the temperature of the electrostatic chuck 102 and flowing helium or other gas from a gas source 148 to a plenum defined between the semiconductor substrate 114 and a support surface 106 of the electrostatic chuck 102. The helium gas is used to facilitate heat transfer between the semiconductor substrate 114 and the substrate support pedestal 116. During the etch process, the semiconductor substrate 114 is gradually heated by the plasma to a steady state temperature. Using thermal control of both the ceiling 120 and the substrate support pedestal 116, the semiconductor substrate 114 is maintained at a predetermined temperature during processing.

Figure 2:
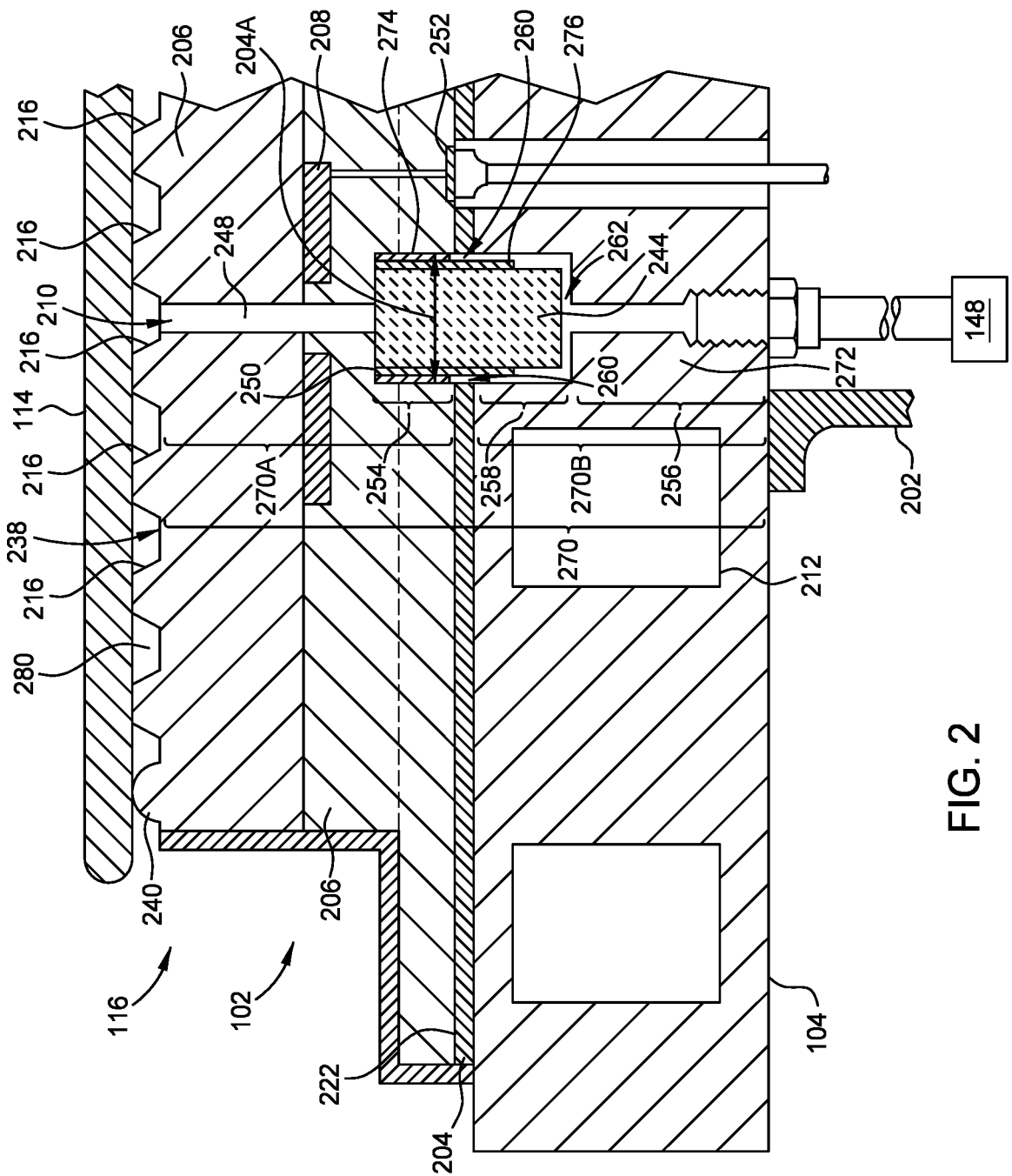
FIG. 2 depicts a partial sectional view of the substrate support pedestal of FIG. 1 illustrating one configuration of the chuck and a gas flow path.

FIG. 2 depicts a vertical cross-sectional view of a first embodiment of the substrate support pedestal 116. The substrate support pedestal 116 is generally supported above the bottom of the process chamber 100 by a base 202 coupled to the cooling base 104 is adhered to the electrostatic stuck by a bond layer 204, a chuck-base bond layer. The substrate support pedestal 116 is fastened to the base 202 such that the substrate support pedestal 116 can be removed from the base 202, refurbished, and re-fastened to the base 202. The base 202 is sealed to the cooling base 104 to isolate various conduits and electrical leads positioned therein from the process environment within the process chamber 100.

The cooling base 104 is generally fabricated from a metallic material such as stainless steel, aluminum, aluminum alloys, among other suitable materials. The cooling base 104 includes one or more passages 212 positioned therein that circulate a heat transfer fluid to maintain thermal control of the substrate support pedestal 116. As discussed above, the cooling base 104 is adhered to the electrostatic chuck 102 by the bond layer 204. The bond layer 204 includes one or more materials such as an adhesive of an acrylic or silicon-based adhesive, epoxy, neoprene, an optically clear adhesive such as a clear acrylic adhesive, or other suitable adhesives.

The electrostatic chuck 102 is generally circular in form but may alternatively take the form of other geometries to accommodate non-circular substrates, for example, square or rectangular substrate such as flat panels. The electrostatic chuck 102 generally includes one or more electrodes 208 embedded within a chuck body 206. The electrodes 208 are formed from an electrically conductive material such as copper, graphite, tungsten, molybdenum and the like. Various embodiments of electrode structures include, but are not limited to, a pair of coplanar D-shaped electrodes, coplanar interdigital electrodes, a plurality of coaxial annular electrodes, a singular, circular electrode or other structure. The electrodes 208 are coupled to the second RF source 122 by a feed through 252 positioned in the substrate support pedestal 116.

The chuck body 206 is fabricated from ceramic. In one embodiment, the chuck body 206 is fabricated from a low resistivity ceramic material (i.e., a material having a resistivity between about $1 \times E^9$ to about $1 \times E^{11}$ ohm-cm). Examples of low resistivity materials include doped ceramics such as alumina doped with titanium oxide or chromium oxide, doped aluminum oxide, doped boron-nitride and the like. Other materials of comparable resistivity, for example, aluminum nitride, may also be used. Such ceramic materials having relatively low resistivity generally promote a Johnsen-Rahbek attractive force between the substrate and electrostatic chuck 102 when power is applied to the electrodes 208. Alternatively, chuck body 206 including ceramic materials having a resistivity equal to or greater than $1Ex^{11}$ ohms-cm may also be used.

In the embodiment depicted in FIG. 2, the support surface 106 of the chuck body 206 includes a plurality of mesas 216 formed inwards of a seal ring 240 formed on the support surface 106. In one example, the seal ring 240 is formed of the same material comprising the chuck body 206. In another example, the seal ring 240 may alternatively be formed from other dielectric materials. The mesas 216 are generally formed from one or more layers of an electrically insulating material having a dielectric constant in the range of about 5 to about 10. Examples of such insulating materials include, but are not limited to, silicon nitride, silicon dioxide, aluminum oxide, tantalum pentoxide, polyimide and the like. Alternatively, the mesas 216 may be formed from the same material as the chuck body and then coated with a high resistivity dielectric film.

In an embodiment of the electrostatic chuck 102 utilizing the Johnson-Rahbeck effect, the chuck body 206 can be formed at least in part from ceramic materials. The chuck body 206 is partially conductive due to the relatively low resistivity of the ceramic materials, thus allowing charges to migrate from the electrodes 208 to the support surface 106 of the chuck body 206. Similarly, charges migrate through the semiconductor substrate 114 and accumulate on the semiconductor substrate 114. The insulating material that the mesas 216 are formed from and/or coated with prevents current flow therethrough. Since each of the mesas 216 has a significantly higher resistivity (i.e. lower dielectric constant) than the chuck body 206, the migrating charges accumulate proximate each of the mesas 216 on the support surface 106 of the electrostatic chuck 102. Although charges also migrate to the portions of the support surface 106 between mesas 216, the dielectric constant of the mesa 216 is substantially greater than the dielectric constant of the backside gas between the backside of the semiconductor substrate 114 and the chuck body surface. This difference in dielectric constant results in the electric field being substantially greater at each mesa 216 than at locations alongside the mesas. Consequently, the clamping force is greatest at each mesa 216 and the invention enables the clamping force to be strictly controlled by placement of the mesas to achieve a uniform charge distribution across the backside of the substrate.

To promote a uniform temperature across a substrate that is retained by the electrostatic chuck, gas (e.g., helium, nitrogen or argon) provided by the gas source 148 is introduced to a plenum 280 defined inward of the seal ring 240 between the support surface 106 of the electrostatic chuck 102 and the semiconductor substrate 114 to provide a heat transfer medium therebetween. The backside gas is generally applied to the plenum 280 through one or more gas flow passages 270 formed through the chuck body 206 and the cooling base 104. Each gas flow passage 270 terminates at an outlet 210 formed through the support surface 238 of the chuck body 206.

The gas flow passage 270 includes a first portion 270A and a second 270B portion. The gas flow passage 270 extends from a top surface of the chuck body 206, the top surface indicated by the outlet 210, from a bottom surface 284 of the cooling base 104. The first portion 270A of the gas flow passage 270 is formed through the chuck body 206. The first portion 270A includes a first chuck passage 248 and a second chuck passage 254. The first chuck passage 248 terminates at one end at the outlet 210 and couples with the second chuck passage 254 at the opposite end. The second chuck passage 254 exits a bottom surface 222 of the chuck body 206. The second chuck passage 254 generally has a sectional area, such as a diameter, that is greater than a sectional area of the first chuck passage 248.

The second portion 270B of the gas flow passage 270 is formed through the cooling base 104. The second portion 270B includes a first base passage 256 and a second base passage 258. The first base passage 256 is coupled at one end to a common port 272. The common port 272 provides an inlet of the gas flow passage 270. The common port 272 is formed in the cooling base 104 and couples with the second base passage 258 at the opposite end. The common port 272 is coupled to the gas source 148. In one example, all gas flow passages 270 are coupled to the gas source 148 through a single common port 272. Alternatively, each gas flow passage 270 may be individually coupled to the gas source 148 through separate common ports 272. The second base passage 258 exits a top of the cooling base 104 and is aligned with the second chuck passage 254 exiting the bottom surface 222 of the chuck body 206. In one example, the second base passage 258 is co-linear with the second chuck passage 254, or in other words, the second base passage 258 and the second chuck passage 254 share a common central axis. The second base passage 258 generally has a sectional area, such as a diameter, that is greater than a sectional area of the first base passage 256.

A porous plug 244 is generally positioned in the gas flow passage 270 between the chuck body 206 and the cooling base 104 such that it forms a part of the gas flow passage 270. The porous plug 244 is generally formed from a ceramic material such as aluminum oxide or aluminum nitride. In one embodiment, the porous plug 244 has a porosity of about 30 to about 80 percent. The porous plug 244 may be positioned in the chuck body 206 in various configurations.

The gas flow passage 270 is configured to shield the bond layer 204 securing the chuck body 206 to the cooling base 104. Various configurations of electrostatic chuck assemblies that include the gas flow passages 270 are discussed in at least FIGS. 3-9 below. The bond layer 204 separates the chuck body 206 from the cooling base 104. A hole 204A in the bond layer 204 has an inner edge 204B surrounding the gas flow passage 270 forming a gap 260 between the chuck body 206 from the cooling base 104 across which gas flows while passing through the gas flow passage 270 between the common port 272 and the outlet 210. Within the gap 260, a swept volume region 262 is defined vertically in-line with the porous plug 244 and the second base passage 258. Essentially all of the gas (e.g., the swept volume) within swept volume region 262 flows through the porous plug 244 positioned in the gas flow passage 270 and out the outlet 210. The swept volume region 262 therefore includes the first portion 270A, the second portion 270B, the porous plug 244, and the portion of the gap 260 vertically aligned between the bottom of the porous plug 244 and the second base passage 258.

In the example depicted in FIG. 2, the porous plug 244 is positioned in the second base passage 258 from the bottom surface 222 of the chuck body 206. The porous plug 244 abuts a step 250 defined in the first portion 270A of the gas flow passage 270 where the first chuck passage 248 meets the second chuck passage 254. The porous plug 244 may be held in place in the chuck body 206 by various techniques. These techniques may include press fit, retaining ring, bonding and pinning, among others, including hot pressing or sintering the porous plug 244 into a singular body with the chuck body 206.

In some embodiments, a sleeve 276 is positioned in the second chuck passage 254 between the porous plug 244 and the chuck body 206. The sleeve 276 may be coupled to the porous plug 244 and the chuck body 206 using various techniques, such as press fit, pinning, and bonding, among others. In the example depicted in FIG. 2, the sleeve 276 is press fit with the porous plug 244 while the sleeve 276 is bonded to the chuck body 206 using an adhesive layer 274. In another example, the sleeve 276 is press fit or otherwise mechanically secured to both the porous plug 244 and the chuck body without use of an adhesive. In other examples, the adhesive layer 274 is used without a sleeve to couple the porous plug 244 directly to the chuck body 206. In other examples, the sleeve 276 is press fit with the chuck body 206 while the sleeve 276 is bonded to the porous plug 244 using the adhesive layer 274 to couple the porous plug 244 to the chuck body 206.

Generally, the porous plug 244 prevents arcing and plasma ignition of the backside gas during processing and plasma cleaning by blocking a direct current path through the backside gas between the substrate and portions of the electrostatic chuck 102. The direct current patch is blocked in the first portion 270A of the gas flow passage 270 proximate the electrodes 208 while minimizing the surface area available for charge accumulation adjacent the backside gas flow path.

Figure 3:
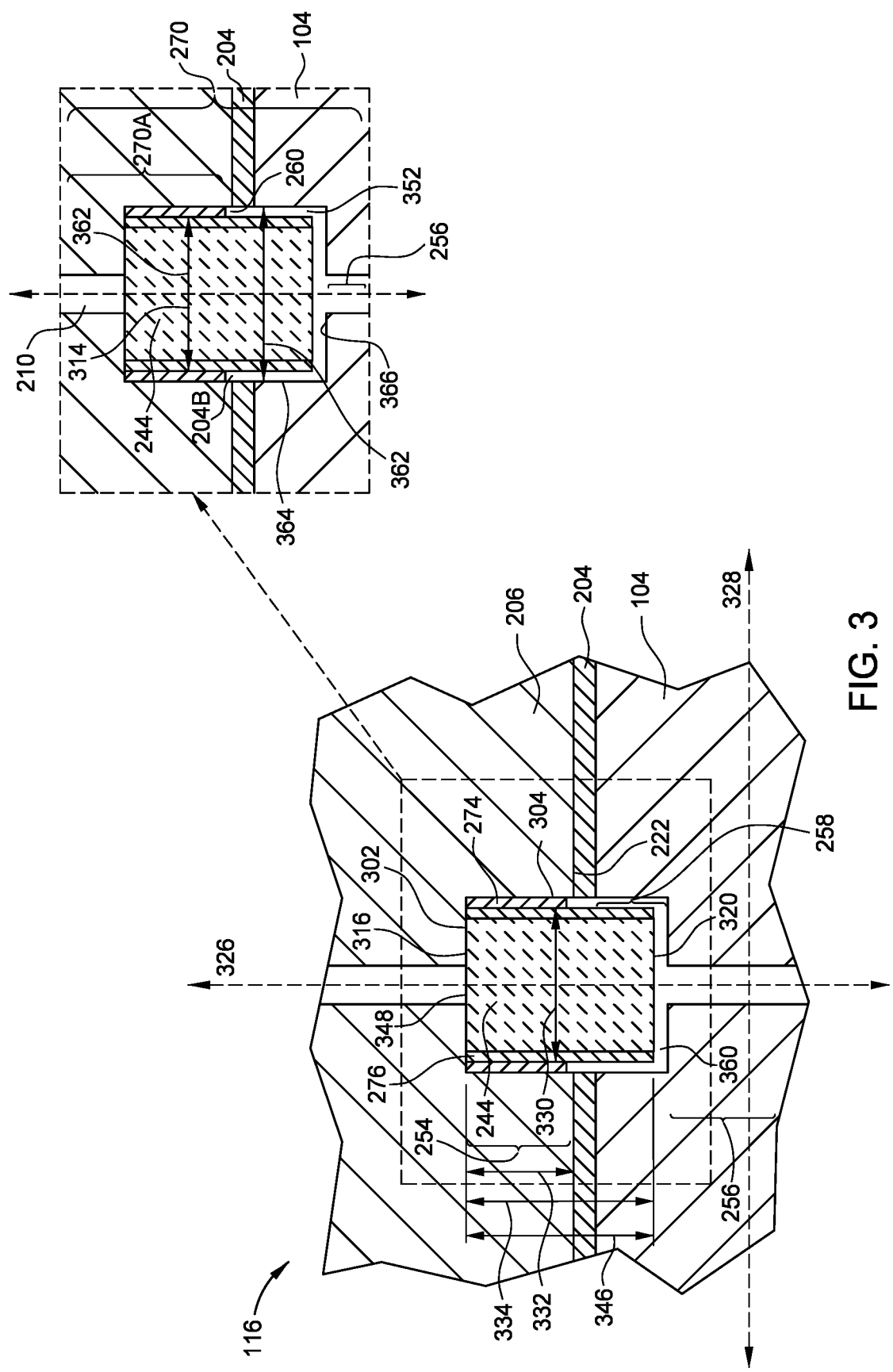
FIG. 3 is a partial sectional view of a substrate support pedestal and a gas flow path according to certain embodiments of the present disclosure.

FIG. 3 is a partial sectional view of the substrate support pedestal 116 of FIG. 2. The second chuck passage 254 formed in the chuck body 206 defines a chuck cavity 348 having a top cavity surface 302, a width 330, and sidewalls 304. The second base passage 258 formed in the cooling base 104 defines a base cavity 360 having a bottom cavity surface 366, a width 362, and sidewalls 364, as shown in the enlarged inset of FIG. 3. The width 330 of the chuck cavity 348 may be substantially equal to the width 362 of the base cavity 360. The porous plug 244 is seated in the chuck cavity 348 formed in the chuck body 206. A portion of the porous plug 244 also extends into the base cavity 360. Alternatively, the porous plug 244 may reside in its entirety in only one of the cavities 348, 360. The porous plug 244 is defined in part by a height 334. In one example, the height 334 is greater than an overall cavity height 332 of the chuck cavity 348.

The porous plug 244 includes a width 314 (shown in the enlarged inset in FIG. 3) measured parallel to a first axis 328 and perpendicular to a second axis 326 that is perpendicular to the first axis 328. The first axis 328 is also the centerline of the gas flow passage 270, while the second axis 326 is parallel with the bottom surface 222 of the chuck body 206.

As shown in FIG. 3, the sleeve 276 is disposed concentrically around the porous plug 244. The sleeve 276 bridges the gap 260 defined between the cooling base 104 and the chuck body 206. By spanning the gap 260, the sleeve 276 physically shields the bond layer 204 from the porous plug 244, and thus, effectively shields the bond layer 204 from the gases flowing through the gas flow passage 270. According, gases flowing through the gas flow passage 270 do not erode the bond layer 204, beneficially extending the life of the substrate support pedestal 116, while advantageously preventing drift in the temperature profile of the electrostatic chuck 102 due to changes in the amount of bond material included in the bond layer 204.

In an example, there is a space between the bottom cavity surface 366 of the base cavity 360 and a bottom surface 320 of the porous plug 244. A first top surface 316 and the bottom surface 320 of the porous plug 244 are parallel to the second axis 328. The first top surface 316 is separated from the bottom surface 320 by a height 334 that defines the length of the porous plug 244. The height 334 of the porous plug 244 is less than a sum of the depths of the cavities 348, 360. The sleeve 276 has a length 346 that is sufficient to bridge the gap 260. Depending upon the example, the length 346 of the sleeve 276 can be less than, equal to or greater than the height 334, but less than a sum of the depths of the cavities 348, 360. In one example, which can be combined with other examples herein, a difference in height between the sleeve 276 and the adhesive layer 274 securing the sleeve 276 to the chuck body 206 is such that the length 346 of the sleeve 276 exceeds a length of the adhesive layer 274.

In an embodiment, the porous plug 244 is not in direct contact with the bottom cavity surface 366 of the base cavity 360 formed in the cooling base 104. Thus, a gap (not labeled with a reference numeral) is formed that efficiently allows gas flowing out of the first base passage 256 to enter the porous plug 244 and continue into the first portion 270A of the gas flow passage 270. The gas flowing out of the first base passage 256 eventually flows out of the outlet 210, shown in the enlarged inset of FIG. 3, and into the plenum 280 (shown in FIG. 2).

The sleeve 276 also functions to create a dead volume 352 (shown in the enlarged view inset in FIG. 3) between the sleeve 276 and the inner edge 204B of the bond layer 204 surrounding the gas flow passage 270. The dead volume 352 is upswept by the gas flowing through the gas flow passage 270. Since the upswept gas residing in the dead volume 352 has little to no kinetic energy as compared to the gas flowing through the gas flow passage 270, the inner edge of the bond layer 204 is beneficially subjected to little to no erosion due to interaction with flowing gas.

Alternative configurations for securing the porous plug 244 that may be utilized in the substrate support pedestal 116 and process chamber 100 depicted in FIG. 2 are illustrated in FIGS. 4-9. The examples depicted in FIGS. 4-9 all physically shield the bond layer 204 from gases flowing through the pedestal, thereby extending the service life of the pedestal while reducing the potential for contamination while processing substrates.

Figure 4:
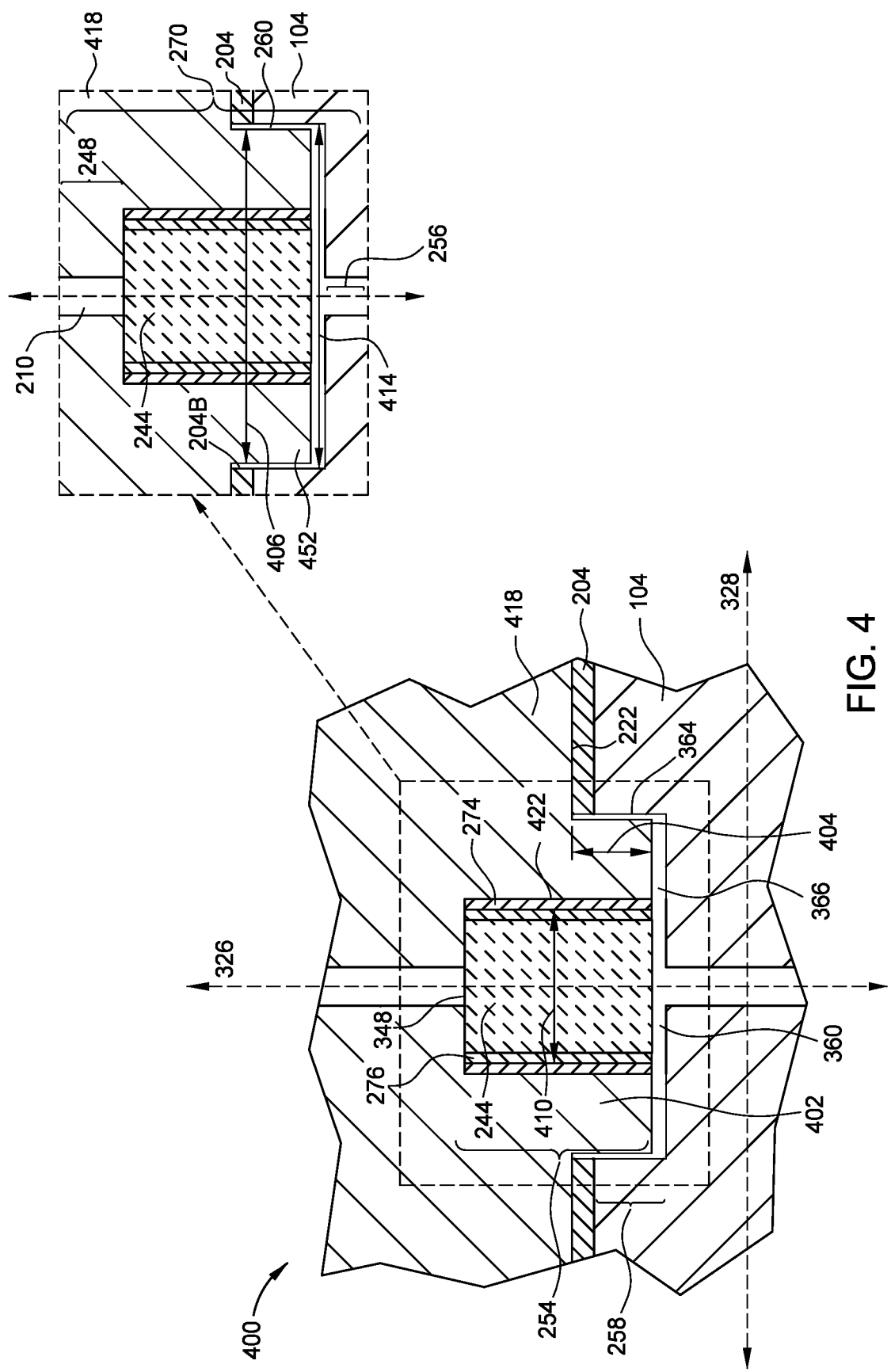
FIG. 4 is a partial sectional view of another substrate support pedestal and a gas flow path according to certain embodiments of the present disclosure.

FIG. 4 is a partial sectional view of a substrate support pedestal 400 according to certain embodiments of the present disclosure. The substrate support pedestal 400 is essentially the same as the substrate support pedestal 116 described above, except for the details of how the porous plug 244 is secured with the gas flow passage 270. As shown in FIG. 4, the substrate support pedestal 400 includes a chuck body 418. The chuck body 418 is essentially the same of the chuck body 206 described above, except that the chuck body 418 includes a ring 402 extending from the bottom surface 222 of the chuck body 418. In the example of FIG. 4, the ring 402 is in the form of a boss extending from the chuck body 418. The ring 402 has a height 404 and a width 308. The second chuck passage 254 formed in the chuck body 206 defines a chuck cavity 348 having a top cavity surface 302, a width 410, and sidewall 422. The second chuck passage 254 extends through the ring 402, and as such, at least a portion of the chuck cavity 348 resides within the ring 402.

The ring 402 extends from the bottom surface 222 to a height 404. The height 404 is greater than the distance across the gap 260 (shown in the enlarged inset of FIG. 4) defined between the chuck body 206 and the cooling base 104. As such, at least a portion of the ring 402 extends into the base cavity 360 defined in the cooling base 104. To accept the ring 402, a width 406 of the ring 402 must be less than a width 414 of the base cavity 360, as shown in the enlarged inset of FIG. 4. Since the ring 402 spans the gap 260 defined between the cooling base 104 and the chuck body 206, the ring 402 physically shields the bond layer 204 from the porous plug 244, and thus, effectively shields the bond layer 204 from the gases flowing through the gas flow passage 270. In such embodiments where the ring 402 bridges the gap 260, the sleeve 276 is optional.

Alternatively, the ring 402 may not completely span the gap 260 defined between the cooling base 104 and the chuck body 206. In such embodiments, the sleeve 276 extends out of the second chuck passage 254 and ring 402 and into the second base passage 258 of the cooling base 104, thus, physically shielding the bond layer 204. The second base passage 258 formed in the cooling base 104 defines a base cavity 360 having a bottom cavity surface 366, a width 362, and sidewalls 364. In one example of the substrate support pedestal 400, the chuck cavity 348 overlaps with the base cavity 360, such that the second base passage 258 and the second chuck passage 254 overlap, as shown in FIG. 4.

In the example depicted in FIG. 4, an adhesive layer 274 is utilized to secure the sleeve 276, or plug 244 when the sleeve 276 is absent. However, the sleeve 276 and adhesive layer 274 may be present and configured as described in any of the examples provided above.

Similar to described above, the ring 402 functions to create a dead volume 452 (shown in the enlarged view inset in FIG. 4) between the outer surface (i.e., outside diameter) of the ring 402 and the inner edge 204B of the bond layer 204 surrounding the gas flow passage 270. The dead volume 452 is upswept by the gas flowing through the gas flow passage 270. Since the upswept gas residing in the dead volume 352 has little to no kinetic energy due to the separation by the ring 402 from the gas flowing through the gas flow passage 270. Accordingly, the inner edge 204B of the bond layer 204 is beneficially subjected to little to no erosion due to interaction with flowing gas.

Figure 5:
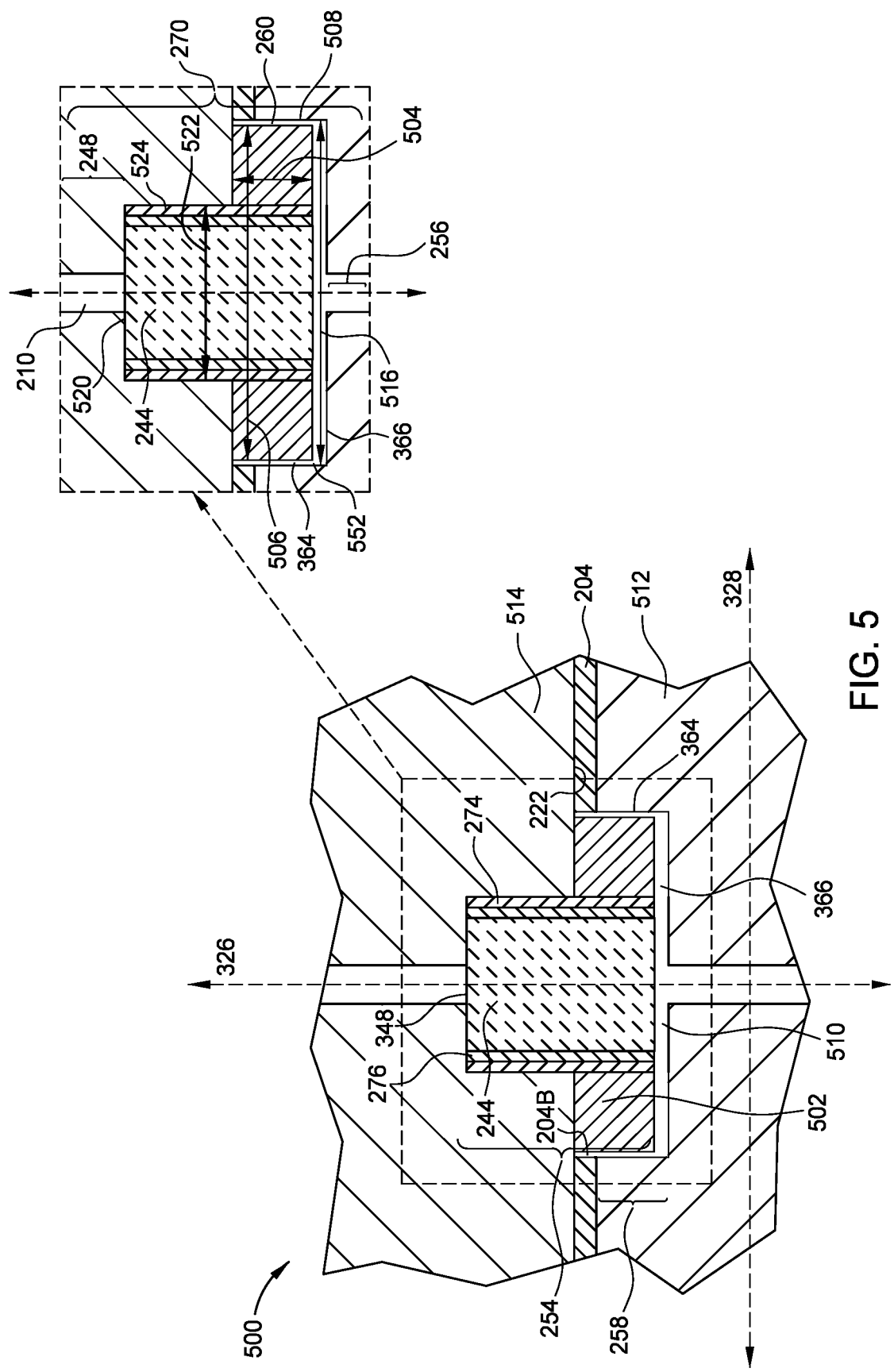
FIG. 5 is a partial sectional view of another substrate support pedestal and a gas flow path according to certain embodiments of the present disclosure.

FIG. 5 is a partial sectional view of another substrate support pedestal 500 according to certain embodiments of the present disclosure. The substrate support pedestal 500 is essentially the same as the substrate support pedestal 116 described above, except for the details of how the porous plug 244 is secured with the gas flow passage 270. As shown in FIG. 5, the substrate support pedestal 500 includes a chuck body 514. The chuck body 514 is essentially the same as the chuck body 206 described above. A ring 502 is positioned in a cavity 510 of the cooling base 512. The ring 502 may be fabricated from one or more individual ring. The base cavity 510 is defined as all or part of second base passage 258 formed in the cooling base 512. The base cavity 510 includes a bottom cavity surface 366, a width 516, and sidewalls 364.

The cooling base 512 may be similar to the cooling base 104 discussed in FIG. 2, but has the cavity 510 configured to fit the ring 502, as opposed to the boss being formed from the chuck body, as shown in other embodiments. The second chuck passage 254 formed in the chuck body 206 defines a chuck cavity 348 having a top cavity surface 520, a width 522, and sidewall 524, as shown in the enlarged inset of FIG. 5. The second chuck passage 254 does not extend through the ring 502, but rather the cooling base cavity 510 receives the ring 502.

The ring 502 extends along a sidewall 508 of the cavity 510 of the cooling base 512. The ring 502 has a height 504 and a width 506. The height 504 of the ring 502 is greater than the distance across the gap 260 defined between the chuck body 514 and the cooling base 512, as shown in the enlarged inset of FIG. 5. To accept the ring 502, the width 506 of the ring 502 must be less than a width 516 of the base cavity 510. Since the ring 502 spans the gap 260 defined between the cooling base 512 and the chuck body 514, the ring 502 physically shields the bond layer 204 from the porous plug 244, and thus, effectively shields the bond layer 204 from the gases flowing through the gas flow passage 270. In such embodiments where the ring 502 bridges the gap 260, the sleeve 276 is optional. In one example, the ring 502 is coupled to at least one of a bottom surface 222 of the electrostatic chuck body, and, in another example, the ring 502 are coupled to a bottom cavity surface 366 of the base cavity 510 of the cooling base 512, where the surface 366 is perpendicular to the first axis 328.

Alternatively, the ring 502 may not completely span the gap 260 defined between the cooling base 512 and the chuck body 514. In such embodiments, the sleeve 276 extends out of the second chuck passage 254 and ring 502 and into the second base passage 258 of the cooling base 512, thus, physically shielding the bond layer 204.

In the example depicted in FIG. 5, an adhesive layer 274 is utilized to secure the sleeve 276, or plug 244 when the sleeve 276 is absent. However, the sleeve 276 and adhesive layer 274 may be present and configured as described in any of the examples provided above.

Similar to described above, the ring 502 functions to create a dead volume 552 (shown in the enlarged view inset in FIG. 5) between the outer surface (i.e., outside diameter) of the ring 502 and the inner edge 204B of the bond layer 204 surrounding the gas flow passage 270. The dead volume 552 is upswept by the gas flowing through the gas flow passage 270. Since the upswept gas residing in the dead volume 552 has little to no kinetic energy due to the separation by the ring 502 from the gas flowing through the gas flow passage 270. Accordingly, the inner edge 204B of the bond layer 204 is beneficially subjected to little to no erosion due to interaction with flowing gas.

Figure 6:
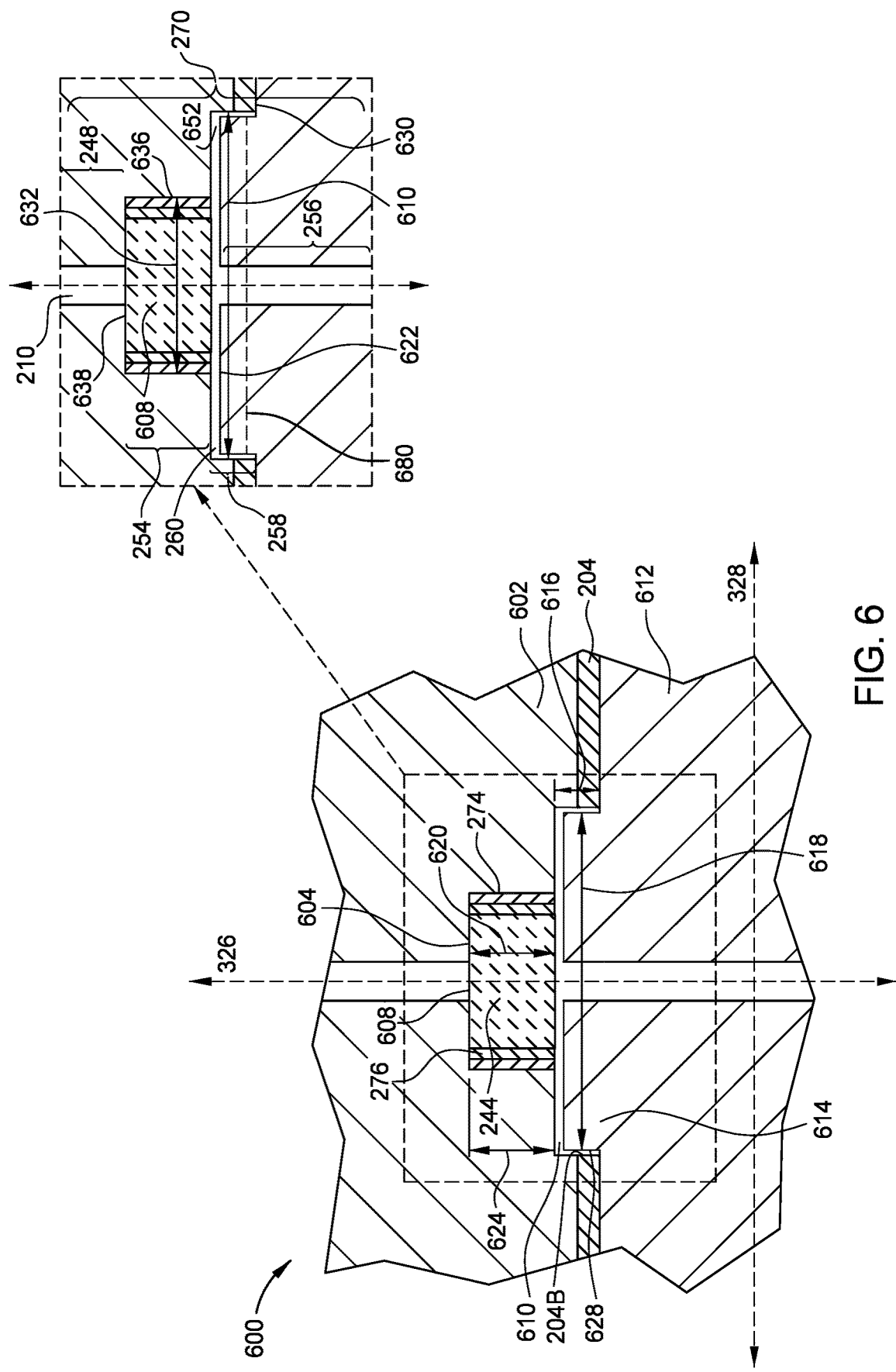
FIG. 6 is a partial sectional view of another substrate support pedestal and a gas flow path according to certain embodiments of the present disclosure.

FIG. 6 is a partial sectional view of another substrate support pedestal 600 according to certain embodiments of the present disclosure. The substrate support pedestal 600 is essentially the same as the substrate support pedestal 116 described above, except for the details of how a porous plug 604 is secured with the gas flow passage 270. The substrate support pedestal 600 comprises a chuck body 602, which is similar to the chuck body 206, but additionally comprises a first chuck cavity 608 and a second chuck cavity 610. The substrate support pedestal 600 also comprises a cooling base 612 similar to the cooling base 104, but the cooling base 612 in FIG. 6 additionally comprises a base ring 614.

The base ring 614 is positioned on a top surface 630 of the cooling base 612. The base ring 614 may be in the form of a boss extends from a top surface 630 of the cooling base 612, or be comprised of one or more separate rings. The base ring 614 has a height 616 and a width 618. The height 616 of the base ring 614 is greater than the distance across the gap 260 defined between the chuck body 602 and the cooling base 612, as shown in the enlarged inset of FIG. 6.

The second chuck cavity 610 formed in the chuck body 602 has a width 622 and sidewalls 628, as shown in the enlarged inset of FIG. 6. The width 632 of the first chuck cavity 608 is less than the width 622 of the second chuck cavity 610. To accept the base ring 614, the width 618 of the base ring 614 must be less than the width 622 of the second chuck cavity 610.

The porous plus 604 is substantially similar to the porous plug 244 discussed above, except that it comprises a height 620 that is less than or substantially similar to a height 624 of a first chuck cavity 608. As such, in contrast to other embodiments discussed herein, the porous plug 604 does not extend into a cooling base 612. Since the base ring 614 extends into the gap 260 defined between the cooling base 612 and the chuck body 602, the base ring 614 physically shields the bond layer 204 from the porous plug 244, and thus, effectively shields the bond layer 204 from the gases flowing through the gas flow passage 270. In such embodiments where the base ring 614 bridges the gap 260, the sleeve 276 is optional. The second chuck passage 254 is defined by the width 632 of the first chuck cavity 608 as well as a sidewall 636 of the first chuck cavity 608 and a top cavity surface 638.

Alternatively, the base ring 614 may not completely span the gap 260 defined between the cooling base 612 and the chuck body 602. In such embodiments, the sleeve 276 extends out of the second chuck passage 254 and base ring 614 and into the second base passage 258 of the cooling base 612, thus, physically shielding the bond layer 204, as shown in the enlarged inset of FIG. 6. In the example depicted in FIG. 6, an adhesive layer 274 is utilized to secure the sleeve 276, or to secure the porous plug 244 when the sleeve 276 is absent. However, the sleeve 276 and adhesive layer 274 may be present and configured as described in any of the examples provided above.

Similar to described above, the base ring 614 functions to create a dead volume 652 (shown in the enlarged view inset in FIG. 6) between the outer surface (i.e., outside diameter) of the base ring 614 and the inner edge 204B of the bond layer 204 surrounding the gas flow passage 270. The dead volume 652 is upswept by the gas flowing through the gas flow passage 270. Since the upswept gas residing in the dead volume 652 has little to no kinetic energy due to the separation by the base ring 614 from the gas flowing through the gas flow passage 270. Accordingly, the inner edge 204B of the bond layer 204 is beneficially subjected to little to no erosion due to interaction with flowing gas.

Figure 7:
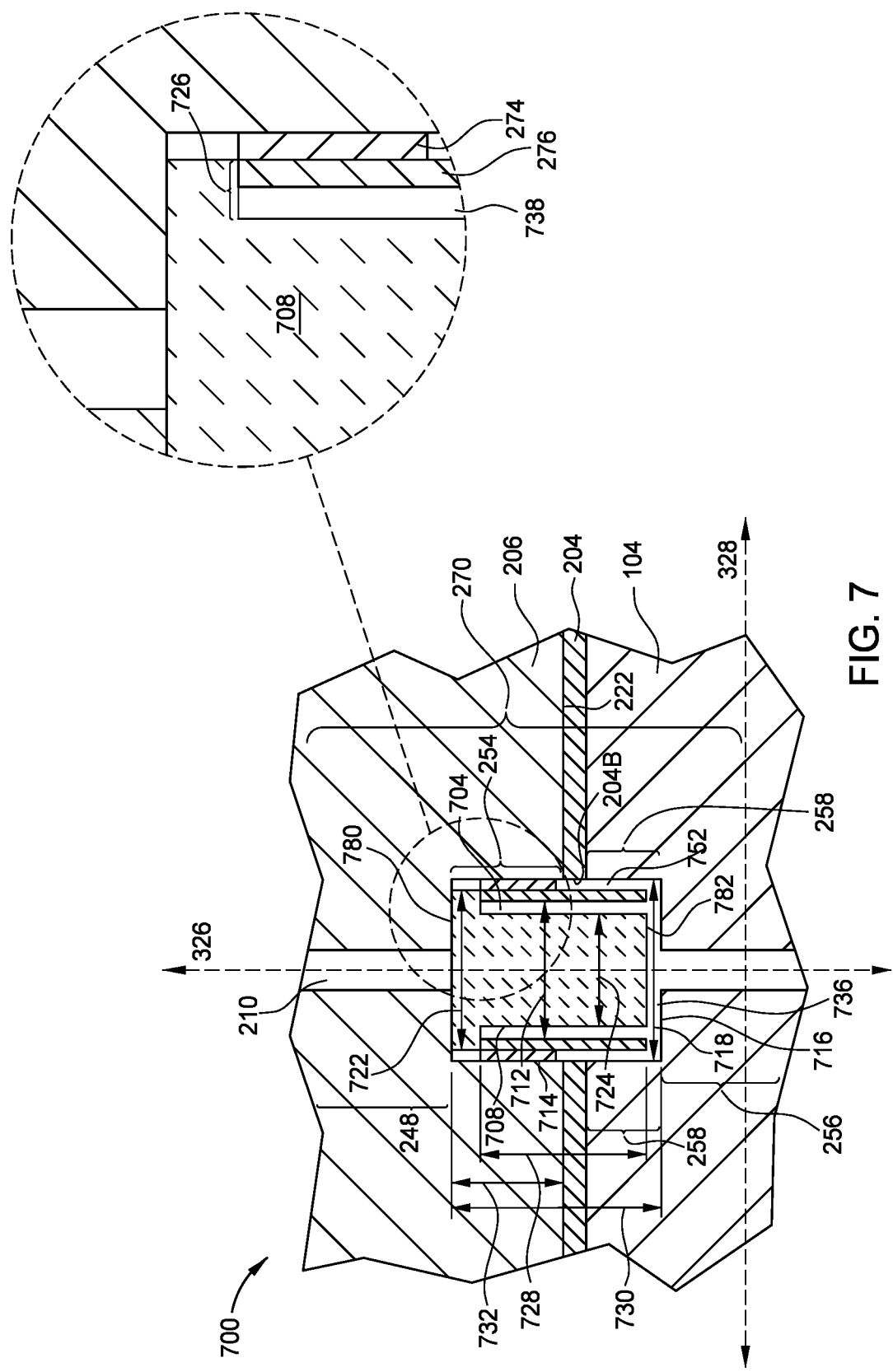
FIG. 7 is a sectional view of another substrate support pedestal and a gas flow path according to certain embodiments of the present disclosure.

FIG. 7 is a partial sectional view of another substrate support pedestal 700. The substrate support pedestal 700 is essentially the same as the substrate support pedestal 116 described above, except for the details of how a porous plug 708 is secured with the gas flow passage 270. The substrate support pedestal 700 comprises a chuck body 206 comprising a chuck cavity 704, and a cooling base 104 that comprises a base cavity 736. The second chuck passage 254 is defined by the chuck cavity 704 that has a top cavity surface 740, a width 712, and sidewall 714.

The second base passage 258 formed in the cooling base 104 defines the base cavity 736 having a bottom cavity surface 366, a width 718, and sidewalls 720. The width 712 of the chuck cavity 704 may be substantially equal to the width 718 of the base cavity 736. The porous plug 708 is similar to the porous plug 244 discussed above except that the porous plug 708 comprises a top diameter 722 that is greater than a bottom diameter 724. As such, an overhang 726 of the porous plug 708 is formed, as shown in the enlarged view in FIG. 7. The porous plug 708 is seated in the chuck cavity 704 formed in the chuck body 206. As further detailed in the enlarged view in FIG. 7, a gap 738 is formed in between the sleeve 276 and the sidewall 714 of the chuck cavity 704.

The porous plug 708 includes a bottom portion 782 and a top portion 780. The bottom portion 782 has a bottom portion height 728 that an outside diameter defined by the bottom diameter 724. The top diameter 722 is greater than a width 712 of the sleeve 276, while the bottom diameter 724 is less than the width 712 of the sleeve 276. The bottom portion 782 of the porous plug 708 may have a press fit or clearance fit with the sleeve 276. Thus, the overhang 726 of the porous plug 708 is supported and captured within the chuck cavity 704 by the sleeve 276.

The bottom portion 782 of the porous plug 708 also extends into the base cavity 736. Alternatively, the entirety of the porous plug 708 may reside in only one of the chuck cavity 704 or the base cavity 736. The porous plug 708 is defined in part by a height 730 that is an overall height of the porous plug 708. In one example, the height 730 is greater than an overall cavity height 732 of the chuck cavity 704. The first axis 328 is also the centerline of the gas flow passage 270, while the second axis 326 is parallel with the bottom surface 222 of the chuck body 206.

As shown in FIG. 7, the sleeve 276 is disposed concentrically around the porous plug 244. The sleeve 276 bridges the gap 260 defined between the cooling base 104 and the chuck body 206. By spanning the gap 260, the sleeve 276 physically shields the bond layer 204 from the porous plug 708, and thus, effectively shields the bond layer 204 from the gases flowing through the gas flow passage 270. Accordingly, gases flowing through the gas flow passage 270 do not erode the bond layer 204, beneficially extending the life of the substrate support pedestal 700, while advantageously preventing drift in the temperature profile of the chuck body 206 due to changes in the amount of bond material comprising the bond layer 204.

In an example, there is a space between the bottom cavity surface 716 of the base cavity 710 and a bottom surface 734 of the porous plug 708. The height 730 of the porous plug 708 defines a distance that is less than a sum of the depths of the chuck cavity 704 and the base cavity 736. The sleeve 276 has a length 346 that is sufficient to bridge the gap 260, and may be less than, equal to or greater than the height 334, but less than a sum of the depths of the cavities 348, 360.

In an embodiment, the porous plug 708 is not in direct contact with the bottom cavity surface 366 of the base cavity 736 formed in the cooling base 104. In this example, a gap (not labeled with a reference numeral) is formed that efficiently allows gas flowing out of the first base passage 256 to enter the porous plug 708 and continue into the second chuck passage 254 and the first chuck passage 248 of the gas flow passage 270. The gas flow eventually exits through of the outlet 210 and into the plenum 280 (as shown in FIG. 2).

The sleeve 276 also functions to create a dead volume 752 between the sleeve 276 and the inner edge 204B of the bond layer 204 surrounding the gas flow passage 270. The dead volume 752, which can include the gap 738 shown in the enlarged view of FIG. 7, is upswept by the gas flowing through the gas flow passage 270. Since the upswept gas residing in the dead volume 752 has little to no kinetic energy as compared to the gas flowing through the gas flow passage 270, the inner edge 204B of the bond layer 204 is beneficially subjected to little to no erosion due to interaction with flowing gas.

Figure 8:
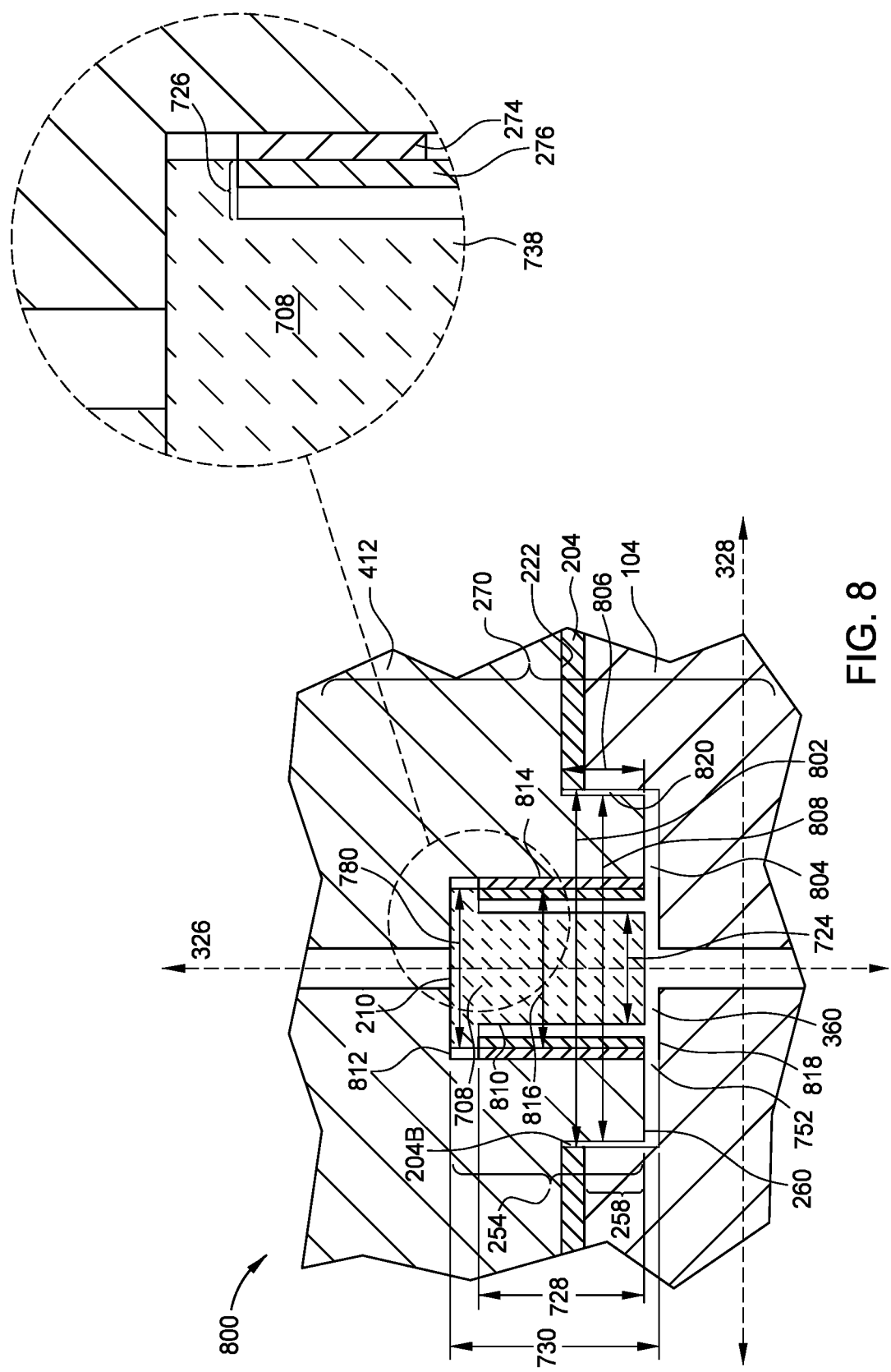
FIG. 8 is a sectional view of another substrate support pedestal and a gas flow path according to certain embodiments of the present disclosure.

FIG. 8 is a partial sectional view of another substrate support pedestal 800 according to certain embodiments of the present disclosure. The substrate support pedestal 800 is essentially the same as the substrate support pedestals 116 and 400 described above, except for the details of how the porous plug 708 is secured with the gas flow passage 270. As shown in FIG. 8, the substrate support pedestal 800 includes a chuck body 412. The chuck body 412 is essentially the same of the chuck body 206 described above, but includes a ring 804 extending from the bottom surface 222 of the chuck body 412. The ring 804 may be in the form of a boss extending from the bottom surface 222 of the chuck body 412, or in the form of or one or more separate rings. The ring 804 has a height 806 and a width 808. The second chuck passage 254 extends through the ring 804, and as such, at least a portion of a chuck cavity 810 resides within the ring 804. The second base passage 258 formed in the cooling base 104 defines the base cavity 360 having a bottom cavity surface 818, a width 802, and sidewalls 820. In one example of the substrate support pedestal 800, the chuck cavity 810 overlaps with the base cavity 360, such that the second base passage 258 and the second chuck passage 254 overlap. The second chuck passage 254 formed in the chuck body 206 defines a chuck cavity 810 having a top cavity surface 812, the width 816, and sidewall 814.

The ring 804 extends from the bottom surface 222 of the chuck body 412 to the height 806. The height 806 of the ring 804 is greater than the distance across the gap 260 (defined between the chuck body 412 and the cooling base 104). As such, at least a portion of the ring 804 extends into the base cavity 360 defined in the cooling base 104. To accept the ring 804, a width 808 of the ring 804 must be less than a width 802 of the base cavity 360. Since the ring 804 spans the gap 260 defined between the cooling base 104 and the chuck body 412, the ring 804 physically shields the bond layer 204 from the porous plug 708, and thus, effectively shields the bond layer 204 from the gases flowing through the gas flow passage 270. In such embodiments where the ring 804 bridges the gap 260, the sleeve 276 is optional.

Alternatively, the ring 804 may not completely span the gap 260 defined between the cooling base 104 and the chuck body 412. In such embodiments, the sleeve 276 extends out of the second chuck passage 254 and ring 804 and into the second base passage 258 of the cooling base 104, thus, physically shielding the bond layer 204.

The porous plug 708 in the substrate support pedestal 800 is similar to the porous plug 244 discussed above except that the porous plug 708 comprises a top diameter 722 that is greater than a bottom diameter 724. Thus, and as shown in the inset, an overhang 726 of the porous plug 708 is created, as shown in the enlarged view in FIG. 8. The overhang 726 of the porous plug 708, as discussed above with reference to FIG. 7, is sized to be supported and captured within the chuck cavity 810 by the sleeve 276. In the example depicted in FIG. 8, an adhesive layer 274 is utilized to secure the sleeve 276 or the porous plug 708 when the sleeve 276 is absent. However, the sleeve 276 and adhesive layer 274 may be present and configured as described in any of the examples provided above.

Similar to described above, the ring 804 functions to create a dead volume 752 (shown in the enlarged view inset in FIG. 4) between the outer surface (i.e., outside diameter) of the ring 804 and the inner edge 204B of the bond layer 204 surrounding the gas flow passage 270. The dead volume 752 is upswept by the gas flowing through the gas flow passage 270. Since the upswept gas residing in the dead volume 752 has little to no kinetic energy due to the separation by the ring 804 from the gas flowing through the gas flow passage 270, the inner edge 204B of the bond layer 204 is beneficially subjected to little to no erosion due to interaction with flowing gas.

Figure 9:
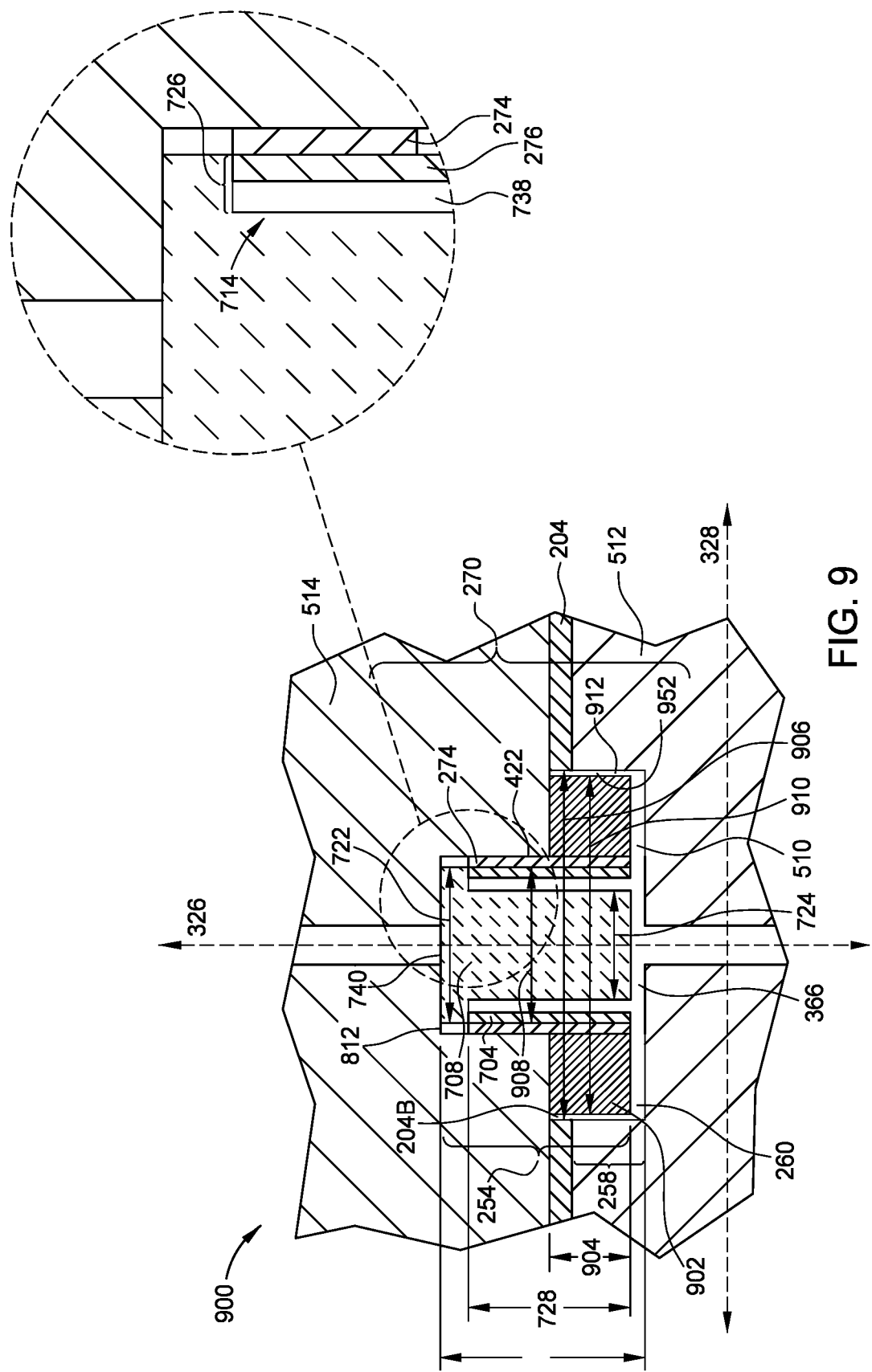
FIG. 9 is a sectional view of yet another substrate support pedestal and a gas flow path according to certain embodiments of the present disclosure.

FIG. 9 is a partial sectional view of another substrate support pedestal 900 according to certain embodiments of the present disclosure. The substrate support pedestal 900 is essentially the same as the substrate support pedestal 116 described above, except for the details of how the porous plug 708 is secured with the gas flow passage 270. As shown in FIG. 9, the substrate support pedestal 900 includes a chuck body 514 that has a chuck cavity 704. The chuck body 514 is essentially the same as the chuck body 206 described above. A ring 902 formed from one or more separate rings is positioned in a cavity 510 of the cooling base 512 The cooling base 512 may be similar to the cooling base 104 discussed in FIG. 2, but has a cavity 510 configured to accept the ring 902. The second chuck passage 254 formed in the chuck body 206 defines a chuck cavity 704 having a top cavity surface 740, a width 908, and a sidewall 714. The second chuck passage 254 does not extend through the ring 902. The second base passage 258 formed in the cooling base 512 defines a base cavity 510 having a bottom cavity surface 366, a width 910, and sidewalls 912.

The porous plug 708 is seated in the chuck cavity 704 formed in the chuck body 206. The porous plug 708 is similar to the porous plug 244 discussed above except that the porous plug 708 comprises a top diameter 722 that is greater than a bottom diameter 724. Accordingly, and as shown in the enlarged inset of FIG. 9, an overhang 726 of the porous plug 708 is created. The overhang 726 of the porous plug 708, as discussed above with reference to FIG. 7, is sized to be supported and captured within the chuck cavity 810 by the sleeve 276. Further in the enlarged view in FIG. 9, a gap 738 is formed in between the sleeve 276 and the sidewall 714 of the chuck cavity 704.

The ring 902 extends along a sidewall 508 of the cavity 510 of the cooling base 512 and has a height 904 and a width 906, the height 904 is greater than the distance across the gap 260 defined between the chuck body 514 and the cooling base 512. To accept the ring 902, the width 906 of the ring 902 must be less than a width 910 of the base cavity 510. Since the boss 802 spans the gap 260 defined between the cooling base 512 and the chuck body 514, the ring 902 physically shields the bond layer 204 from the porous plug 708, and thus, effectively shields the bond layer 204 from the gases flowing through the gas flow passage 270. In such embodiments where the ring 902 bridges the gap 260, the sleeve 276 is optional.

Alternatively, the ring 902 may not completely span the gap 260 defined between the cooling base 512 and the chuck body 514. In such embodiments, the sleeve 276 extends out of the second chuck passage 254 and ring 902 and into the second base passage 258 of the cooling base 512, thus, physically shielding the bond layer 204.

In the example depicted in FIG. 9, an adhesive layer 274 is utilized to secure the sleeve 276, or plug 244 when the sleeve 276 is absent. However, the sleeve 276 and adhesive layer 274 may be present and configured as described in any of the examples provided above.

Similar to described above, the ring 902 functions to create a dead volume 952 between the outer surface (i.e., outside diameter) of the ring 902 and the inner edge 204B of the bond layer 204 surrounding the gas flow passage 270. The dead volume 952 is upswept by the gas flowing through the gas flow passage 270. Since the upswept gas residing in the dead volume 952 has little to no kinetic energy due to the separation by the ring 902 from the gas flowing through the gas flow passage 270, the inner edge 204B of the bond layer 204 is beneficially subjected to little to no erosion due to interaction with flowing gas.

Although various embodiments which incorporate the teachings of the present invention have been shown and described in detail herein, those skilled in the art can readily devise many other varied embodiments that still incorporate these teachings.

What is claimed is:

1. A substrate support pedestal, comprising:
    a cooling base having a top surface;
    an electrostatic chuck body having a bottom surface disposed over the top surface of the cooling base;
    a bond layer securing the electrostatic chuck to the cooling base;
    a gas flow passage formed between a top surface of the electrostatic chuck body and a bottom surface of the cooling base, the gas flow passage passing through the bond layer;
    a porous plug disposed in the gas flow passage, the porous plug extending past a portion of the bottom surface of the electrostatic chuck that is in contact with the bond layer, through a hole in the bond layer, and past a portion of the top surface of the cooling base that is in contact with the bond layer;
    a sleeve disposed around the porous plug; and
    a dead volume defined between the sleeve and the inside edge of the bond layer.

2. The substrate support pedestal of claim 1, wherein the porous plug is at least partially disposed in a chuck cavity formed in a bottom surface of the electrostatic chuck body.

3. The substrate support pedestal of claim 2, wherein the porous plug is at least partially disposed in a base cavity formed in a top surface of the cooling base.

4. The substrate support pedestal of claim 1, wherein the porous plug is coupled to the electrostatic chuck body via an adhesive layer or via a press fit.

5. The substrate support pedestal of claim 1 further comprising:
    a seal extending across a gap formed between the electrostatic chuck body and the cooling base, wherein an inside edge of the hole formed in the bond layer physically shielded from a swept volume of the gas flow passage by the sleeve.

6. The substrate support pedestal of claim 1, wherein the electrostatic chuck body further comprises:
    a ring extending from a bottom surface of the electrostatic chuck body, the gas flow passage extending through the ring.

7. The substrate support pedestal of claim 6 further comprising:
    a sleeve positioned between the ring and the porous plug residing in the ring.

8. The substrate support pedestal of claim 7, wherein the sleeve extends from the ring to the cooling base, wherein an inside edge of the hole formed in the bond layer physically shielded from a swept volume of the gas flow passage by the ring and the sleeve.

9. The substrate support pedestal of claim 1, wherein a ring extends across a gap formed between the electrostatic chuck body and the cooling base, wherein an inside edge of the hole formed in the bond layer physically shielded from a swept volume of the gas flow passage by the ring.

10. The substrate support pedestal of claim 1 further comprising:
    a ring coupled to at least one of a bottom surface of the electrostatic chuck body and a top surface of the cooling base, the gas flow passage passing through the ring, the ring extending across a gap formed between the electrostatic chuck body and the cooling base, wherein an inside edge of the hole formed in the bond layer physically shielded from a swept volume of the gas flow passage by the ring.

11. The substrate support pedestal of claim 1, further comprising:
    a ring extending from a top surface of the cooling base, the gas flow passage extending through the ring.

12. The substrate support pedestal of claim 11, wherein the ring extends across a gap formed between the electrostatic chuck body and the cooling base, wherein an inside edge of the hole formed in the bond layer physically shielded from a swept volume of the gas flow passage by the ring.

13. The substrate support pedestal of claim 11 further comprising:
    a sleeve positioned between the ring and the porous plug residing in the ring.

14. The substrate support pedestal of claim 13, wherein the sleeve extends from the ring to the electrostatic chuck body, wherein an inside edge of the hole formed in the bond layer physically shielded from a swept volume of the gas flow passage by the ring and the sleeve.

15. A substrate support pedestal, comprising:
    an electrostatic chuck body having a bottom surface bonded to a top surface of a cooling base via a bond layer, the bond layer having a thickness defining a gap between the electrostatic chuck body and the cooling base;
    a gas flow passage formed between a top surface of the electrostatic chuck body and a bottom surface of the cooling base; and
    a porous plug disposed in the gas passage and extending into the electrostatic chuck body from within the cooling base;
    a sleeve disposed around the porous plug; and
    a dead volume defined between the sleeve and the inside edge of the gas passage.

16. The substrate support of claim 15 further comprising:
    a ring extending from one of the electrostatic chuck body and the cooling base, and wherein the gas flow passage having a swept volume physically shielded from an inside edge of a hole formed in the bond layer by at least one of the sleeve.

17. A substrate processing chamber, comprising:
    chamber walls and a lid defining a processing volume; and
    a substrate support pedestal disposed in the processing volume, the substrate support pedestal configured to support a substrate thereon, the substrate support pedestal, comprising:
    a cooling base having a top surface;

an electrostatic chuck body having a bottom surface disposed over the top surface of the cooling base;

a bond layer securing the electrostatic chuck to the cooling base;

a gas flow passage formed between a top surface of the electrostatic chuck body and a bottom surface of the cooling base, the gas flow passage passing through the bond layer;

a porous plug disposed in the gas flow passage, the porous plug extending past a portion of the bottom surface of the electrostatic chuck that is in contact with the bond layer, through a hole in the bond layer, and past a portion of the top surface of the cooling base that is in contact with the bond layerU;

a sleeve disposed around the porous plug; and a dead volume defined between the sleeve and the inside edge of the bond layer.

18. The substrate support pedestal of claim 17, wherein the porous plug is coupled to the electrostatic chuck body via at least one of an adhesive layer or via a press fit.

19. The substrate support pedestal of claim 17 further comprising:

a seal extending across a gap formed between the electrostatic chuck body and the cooling base, wherein an inside edge of the hole formed in the bond layer physically shielded from a swept volume of the gas flow passage by the sleeve.

* * * * *